United States Patent
Seddon et al.

(10) Patent No.: US 10,388,526 B1
(45) Date of Patent: Aug. 20, 2019

(54) SEMICONDUCTOR WAFER THINNING SYSTEMS AND RELATED METHODS

(71) Applicant: SEMICONDUCTOR COMPONENTS INDUSTRIES, LLC, Phoenix, AZ (US)

(72) Inventors: Michael J. Seddon, Gilbert, AZ (US); Thomas Neyer, Munich (DE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/958,123

(22) Filed: Apr. 20, 2018

(51) Int. Cl.
*H01L 21/04* (2006.01)
*B24B 37/20* (2012.01)
*H01L 21/67* (2006.01)

(52) U.S. Cl.
CPC .......... *H01L 21/0475* (2013.01); *B24B 37/20* (2013.01); *H01L 21/67115* (2013.01)

(58) Field of Classification Search
CPC ............... B24B 7/228; H01L 21/02013; H01L 21/02021; H01L 21/0475; H01L 21/304; H01L 21/3046; H01L 21/322–3228; H01L 21/463
See application file for complete search history.

(56) References Cited

U.S. PATENT DOCUMENTS

| | | | |
|---|---|---|---|
| 9,481,051 B2 | 11/2016 | Hirata et al. | |
| 9,620,415 B2 | 4/2017 | Hirata et al. | |
| 9,808,884 B2 | 11/2017 | Hirata et al. | |
| 9,815,138 B2 | 11/2017 | Hirata | |
| 9,868,177 B2 | 1/2018 | Hirata | |
| 9,878,397 B2 | 1/2018 | Hirata et al. | |
| 2005/0142815 A1* | 6/2005 | Miyazaki | H01L 21/02238 438/464 |
| 2016/0228984 A1 | 8/2016 | Hirata et al. | |
| 2016/0228985 A1 | 8/2016 | Hirata et al. | |
| 2016/0288250 A1 | 10/2016 | Hirata et al. | |
| 2016/0288251 A1 | 10/2016 | Hirata et al. | |
| 2016/0293397 A1 | 10/2016 | Hirata et al. | |
| 2016/0305042 A1 | 10/2016 | Hirata | |
| 2016/0307763 A1 | 10/2016 | Hirata | |
| 2016/0354862 A1 | 12/2016 | Hirata | |
| 2017/0015017 A1 | 1/2017 | Hirata | |
| 2017/0025275 A1 | 1/2017 | Hirata et al. | |
| 2017/0025276 A1 | 1/2017 | Hirata | |
| 2017/0053829 A1 | 2/2017 | Hirata et al. | |
| 2017/0066078 A1 | 3/2017 | Morikazu et al. | |

(Continued)

FOREIGN PATENT DOCUMENTS

| | | |
|---|---|---|
| JP | 2001-341122 A | 12/2001 |
| JP | 2016-146446 A | 8/2016 |

(Continued)

*Primary Examiner* — Daniel P Shook
(74) *Attorney, Agent, or Firm* — IPTechLaw

(57) ABSTRACT

Semiconductor substrate thinning systems and methods. Implementations of a method of thinning a semiconductor substrate may include: providing a semiconductor substrate having a first surface and a second surface opposing the first surface and inducing damage into a portion of the semiconductor substrate adjacent to the second surface forming a damage layer. The method may also include backgrinding the second surface of the semiconductor substrate.

20 Claims, 11 Drawing Sheets

(56) References Cited

U.S. PATENT DOCUMENTS

| | | |
|---|---|---|
| 2017/0136572 A1 | 5/2017 | Hirata |
| 2017/0151627 A1 | 6/2017 | Hirata |
| 2017/0198411 A1 | 7/2017 | Hirata |
| 2017/0291255 A1 | 10/2017 | Hirata |
| 2017/0348796 A1 | 12/2017 | Nishino et al. |
| 2017/0352781 A1 | 12/2017 | Obuchi et al. |

FOREIGN PATENT DOCUMENTS

| | | |
|---|---|---|
| JP | 2016-146447 A | 8/2016 |
| JP | 2016-146448 A | 8/2016 |
| JP | 2016-151457 A | 8/2016 |
| JP | 2016-197698 A | 11/2016 |
| JP | 2016-197699 A | 11/2016 |
| JP | 2016-197700 A | 11/2016 |
| JP | 2016-198788 A | 12/2016 |
| JP | 2016-207702 A | 12/2016 |
| JP | 2016-207703 A | 12/2016 |
| JP | 2016-225535 A | 12/2016 |
| JP | 2016-225536 A | 12/2016 |
| JP | 2017-005008 A | 1/2017 |
| JP | 2017-022283 A | 1/2017 |
| JP | 2017-024014 A | 2/2017 |
| JP | 2017-024039 A | 2/2017 |
| JP | 2017-024188 A | 2/2017 |
| JP | 2017-028072 A | 2/2017 |
| JP | 2017-041481 A | 2/2017 |
| JP | 2017-041482 A | 2/2017 |
| JP | 2017-057103 A | 3/2017 |
| JP | 2017-092314 A | 5/2017 |
| JP | 2017-121742 A | 7/2017 |
| JP | 2017-123405 A | 7/2017 |
| JP | 2017-188586 A | 10/2017 |
| JP | 2017-189870 A | 10/2017 |
| JP | 2017-215303 A | 12/2017 |
| JP | 2017-216423 A | 12/2017 |
| JP | 2017-216424 A | 12/2017 |
| JP | 2017-220631 A | 12/2017 |

* cited by examiner

SEMICONDUCTOR WAFER THINNING SYSTEMS AND RELATED METHODS

BACKGROUND

1. Technical Field

Aspects of this document relate generally to systems and methods for thinning wafers, such as systems and methods for thinning semiconductor substrates. More specific implementations involve systems and methods for thinning silicon carbide substrates.

2. Background

Semiconductor substrates are typically thinned following separation from a boule using a backgrinding process. The backgrinding process usually involves grinding a surface of the substrate using a grinding wheel which includes a plurality of teeth and rotates over the surface of the substrate.

SUMMARY

Implementations of a method of thinning a semiconductor substrate may include: providing a semiconductor substrate having a first surface and a second surface opposing the first surface and inducing damage into a portion of the semiconductor substrate adjacent to the second surface forming a damage layer. The method may also include backgrinding the second surface of the semiconductor substrate.

Implementations of the method of thinning may include one, all, or any of the following:

A lifetime of a backgrinding wheel may be increased through the presence of the damage layer.

After backgrinding the second surface of the semiconductor substrate, the method may include inducing damage into a portion of the semiconductor substrate adjacent to the second surface forming a second damage layer and backgrinding the second surface of the semiconductor substrate to remove at least the second damage layer.

After inducing damage into a portion of the semiconductor substrate, the method may include again inducing damage into a portion of the semiconductor substrate adjacent to the second surface before backgrinding the second surface of the semiconductor substrate.

A thinning rate may be increased while a backgrinding wheel grinds the damage layer.

Inducing damage into the portion of the semiconductor substrate may further include irradiating the second surface with a laser beam at a focal point within the semiconductor substrate at a plurality of spaced apart locations along the second surface to form the damage layer.

The method may further include forming one or more cracks into the semiconductor substrate surrounding each of the plurality of spaced apart locations.

The semiconductor may be silicon carbide.

Irradiating the second surface with the laser beam at the focal point within the semiconductor substrate at the plurality of spaced apart locations may further include irradiating the plurality of spaced apart locations using a predefined path.

In various method implementations, the predefined path may be an alternating single pass path, an intersecting single pass path, a spiral single pass path, an alternating dual pass path, a dual intersecting pass path, a spiral dual pass path, a random single pass path, a random dual pass path, a single pass path, a two or more pass path, an intersecting single pass path, an intersecting dual pass path, an overlapping single pass path, an overlapping dual pass path, or any combination thereof.

Inducing damage into the portion of the semiconductor substrate may further include bombarding the second surface with a plurality of ions from a plasma adjacent to the second surface to form the damage layer.

Inducing damage into the portion of the semiconductor substrate may further include implanting the second surface with a plurality of ions to form the damage layer.

Inducing damage into the portion of the semiconductor substrate may further include exposing the second surface to an etchant to form the damage layer.

Inducing damage into the portion of the semiconductor substrate may further include locally rapidly cooling the second surface to form the damage layer.

Inducing damage into the portion of the semiconductor substrate may further include locally rapidly heating the second surface to form the damage layer.

The method may include locally rapidly heating the first surface while locally rapidly cooling the second surface to form the damage layer.

The method may include locally rapidly heating the second surface while locally rapidly cooling the first surface to form the damage layer.

Implementations of a method of preparing a semiconductor substrate for thinning may include providing a semiconductor substrate having a first surface and a second surface opposing the first surface. The method may include forming a damage layer in a portion of the semiconductor substrate adjacent to the second surface where the damage layer is configured to increase a thinning rate when a backgrinding wheel is grinding the damage layer.

Implementations of the method of preparing a semiconductor substrate for thinning may include one, all, or any of the following:

Forming the damage layer in the portion of the semiconductor substrate adjacent to the second surface may further include irradiating the second surface with a laser beam at a focal point within the semiconductor substrate at a plurality of spaced apart locations along the second surface to form the damage layer.

The substrate may be silicon carbide.

The method may further include forming one or more cracks into the semiconductor substrate surrounding each of the plurality of spaced apart locations.

Forming the damage layer in the portion of the semiconductor substrate adjacent to the second surface may further include bombarding the second surface with a plurality of ions to form the damage layer, implanting the second surface with a plurality of ions to form the damage layer, exposing the second surface to an etchant to form the damage layer, locally rapidly cooling the second surface to form the damage layer, locally rapidly heating the second surface to form the damage layer, locally rapidly heating the first surface while locally rapidly cooling the second surface to form the damage layer, locally rapidly heating the second surface while locally rapidly cooling the first surface to form the damage layer, or any combination thereof.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor substrates and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor substrates and related methods, and implementing components and methods, consistent with the intended operation and methods.

A wide variety of semiconductor substrate types exist and are used in the process of manufacturing semiconductor devices. Non-limiting examples of semiconductor substrates that may be processed using the principles disclosed in this document include single crystal silicon, silicon dioxide, glass, silicon-on-insulator, gallium arsenide, sapphire, ruby, silicon carbide, polycrystalline or amorphous forms of any of the foregoing, and any other substrate type useful for constructing semiconductor devices. Particular implementations disclosed herein may utilize silicon carbide semiconductor substrates (silicon carbide substrates). In this document the term "wafer" is also used along with "substrate" as a wafer is a common type of substrate, but not as an exclusive term that is used to refer to all semiconductor substrate types. The various semiconductor substrate types disclosed in this document may be, by non-limiting example, round, rounded, square, rectangular, or any other closed shape in various implementations.

Figure 1:
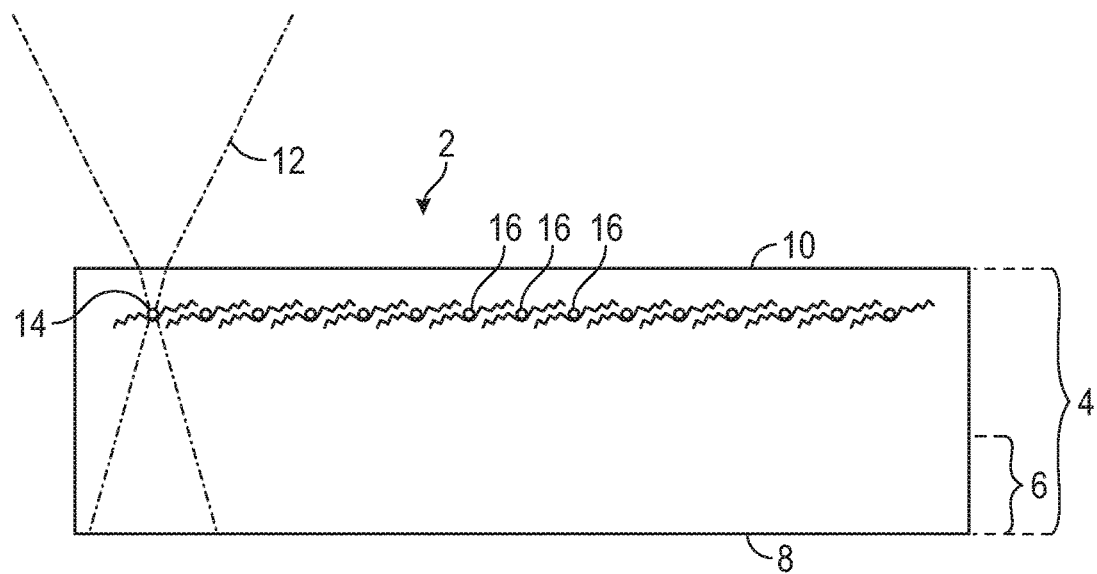
FIG. 1 is a cross sectional view of a semiconductor substrate (silicon carbide in this case) being irradiated using a laser forming a plurality of spaced apart locations.

Referring to FIG. 1, a cross sectional view of a semiconductor substrate 2 is illustrated. As illustrated, the substrate 2 has an original thickness 4 which was created when it was separated from the boule it was originally cut or otherwise separated from. Either before processing of the substrate 2 to form semiconductor devices thereon or after processing, the substrate 2 is desired to be thinned to thickness 6. Thinned substrates may provide various desirable characteristics for performance of the semiconductor devices, such as, by non-limiting example, lower on resistance, better heat performance, small package form factor/thickness, etc. Thinning of the substrate may also be driven by factors that include the inability to get the substrate to separate from the boule to produce a substrate below a certain thickness due to substrate formation process limitations or wafer processing equipment limitations that prevent processing of wafers below a certain thickness. Many reasons may exist that drive the need/interest in thinning the semiconductor substrate.

The thinning of semiconductor substrates is often done using backgrinding, where a backgrinding wheel is applied to the back of the semiconductor substrate ("back" referring to the side of the substrate that does not have semiconductor devices formed thereon) and operated in a circularly eccentric matter to uniformly remove the material from the entire backside of the wafer. Some backside grinding techniques, such as Taiko grinding, however, do not remove all the material from the entire backside of the wafer, but leave a ring (Taiko ring" around the thinned wafer to give it additional support. The ultimate thickness of the semiconductor substrate following back grinding is determined by various factors, including the material properties of the substrate itself.

Various examples of processing methods for thinning semiconductor substrates are given in this document using silicon carbide substrates as an example. However, these principles can be applied to many other semiconductor substrate types, including any disclosed in this document.

Referring to FIG. 1, the substrate 2 has a first surface (side) 8 and a second surface (side) 10. In various implementations, the first surface 8 may be that which has or will have semiconductor devices formed thereon and the second surface 10 may be that which may be referred to as the "back side" of the wafer. As illustrated, a laser beam 12 is irradiating the second surface 10 of the substrate 2. A focal point 14 of the laser beam 12 is set so that it is located within the semiconductor substrate below the second surface 10. The wavelength of the laser light used to irradiate the second surface 10 is one for which the material of the particular semiconductor substrate is at least partially optically transmissive, whether translucent or transparent. The focal point 14 creates a damage area in the substrate 2 at and around the focal point 14. The degree of damage is determined by many factors, including, by non-limiting example, the power of the laser light, the duration of exposure of the material, the absorption of the material of the substrate, the crystallographic orientation of the substrate material relative to the direction of the laser light, the atomic structure of the substrate, and any other factor regulating the absorbance of the light energy and/or transmission of the induced damage or heat into the substrate.

The substrate 2 illustrated in FIG. 1 is a silicon carbide (SiC) substrate, and so the laser light wavelength that may be employed may be any capable of transmitting into the SiC substrate material. In particular implementations, the wavelength may be 1064 nm. In various implementations, the laser light source may be a Nd:YAG pulsed laser or a YVO4 pulsed laser. In one implementation where a Nd:YAG laser is used, a spot size of 10 microns and an average power of 3.2 W may be used along with a repetition frequency of 80 kHz, pulse width of 4 ns, numerical aperture (NA) of the focusing lens of 0.45. In another implementation, a Nd:YAG laser may be used with a repetition frequency of 400 kHz, average power of 16 W, pulse width of 4 ns, spot diameter of 10 microns, and NA of 0.45. In various implementations, the power of the laser may be varied from about 2 W to about 4.5 W. In other implementations, however, the laser power may be less than 2 W or greater than 4.5 W.

As illustrated, the focal point 14 of the laser light forms a location of rapid heating and may result in full or partial melting of the material at the focal point 14. The point of rapid heating and the resulting stress on the hexagonal single crystal structure of the SiC substrate results in cracking of the substrate material along a c-plane of the substrate. Depending on the type of single SiC crystal used to manufacture the boule, the c-plane may be oriented at an off angle to the second surface of about 1 degree to about 6 degrees. In various implementations, this angle is determined at the time the boule is manufactured. In particular implementations, the off angle may be about 4 degrees.

During operation, the laser is operated in pulsed operation to create numerous overlapping spots of pulsed light while passing across the surface of the substrate. As a result, a continuous/semi-continuous layer/band of modified material is formed within the wafer. In other implementations, the laser may be operated in continuous wave mode rather than pulsed mode to create the band of modified material. As illustrated, the stress caused by the focal point 14 causes cracking along the c-plane in the material of the SiC substrate 2 in one or both directions along the c-plane or in both directions. These cracks are illustrated as spreading from the focal point 14 area (where the modified layer/band is located) angled at the off angle in FIG. 1. In various implementations, the cracks may be located below the focal point 14, above the focal point 14, or spread directly from the focal point 14, depending on the characteristics of the laser and the method of application of the laser to the material. In various implementations, the length of the cracks into the substrate is a function of the power of the laser applied. By non-limiting example, the depth of the focal point was set at 500 um into the substrate; where the laser power was 3.2 W, the crack propagation from the modified layer/band was about 250 um; where the laser power was at 2 W, the crack lengths were about 100 um; where the laser power was set at 4.5 W, the crack lengths were about 350 um.

As illustrated, the substrate 2 can be indexed below the laser beam 12 (or the laser beam 12 can be indexed above the substrate 2, or both can be indexed together) to produce a plurality of spaced apart locations 16 where damage has been induced in the substrate. The width between the plurality of spaced apart locations can be a function of the crack lengths into the material of the wafer, and/or the amount of damage layer formed as a wafer is initially scanned. By non-limiting example, the width may be set between about the length of the cracks into the wafer to about twice the length of the cracks into the wafer. In situations where the damage layer is being initially formed during scanning over the wafer on one side of the wafer, the width between the spaced apart locations can be initially reduced. By non-limiting example, initially the width may be set to 200 um until the cracks begin to spread from the modified layer, at which point the width (index amount) may be set to 400 um. The feed speed of the wafer under the laser (or the laser above the wafer) may be, by non-limiting example, 400 mm/second, though slower or faster feed speeds may be used in various implementations.

While a plurality of spaced apart locations 16 are illustrated, in various implementations, the laser beam 12 may not be applied in an indexed manner, but may be applied in a continuous or substantially continuous manner to the material of the substrate to create continuous or substantially continuous zones/areas of damage in the substrate. These areas of damage may include corresponding continuous cracking or discontinuous cracking of the substrate material. The plurality of spaced apart locations 16 or the continuous lines/areas affected by the laser irradiation form a damage layer within the semiconductor substrate after the laser has completed indexing/passing over the semiconductor substrate material.

The objective of forming the damage layer is to break up the structure of the semiconductor substrate material (in the case of SiC, the hexagonal crystalline structure of the substrate). The resulting broken up structure is then more easily removed by a backgrinding wheel during backgrinding operations, as the damaged material of the semiconductor substrate no longer can as uniformly resist the abrasion/erosion process. In various implementations, the effect of the damage layer may be observed in various backgrinding parameters, such as, by non-limiting example, increasing the thinning rate of the semiconductor substrate, increasing a lifetime of a backgrinding wheel, reducing the time required to thin the semiconductor substrate to a desired thickness, reducing the wear rate on the backgrinding wheel, or any other backgrinding process parameter. The effect on the backgrinding parameters may be observed just while the damage layer is being removed during the backgrinding process, or may extend beyond the removal of the material associated with the damage layer.

In various implementations, the process of irradiating the semiconductor substrate with laser light may be repeated one or more times after the damage layer has been removed after backgrinding, followed by additional backgrinding after each laser light irradiation to remove the newly formed damage layer until the semiconductor substrate has been thinned to the desired thickness. In other implementations, however, two or more passes with the laser light may be employed to create the damage layer. In some implementations, two or more passes with focal points at different depths into the semiconductor substrate may be employed to form multiple damage layers or a damage layer of greater thickness into the material of the semiconductor substrate. These various processing options, including multi-pass options, will be discussed in greater depth later in this document.

Figure 2:
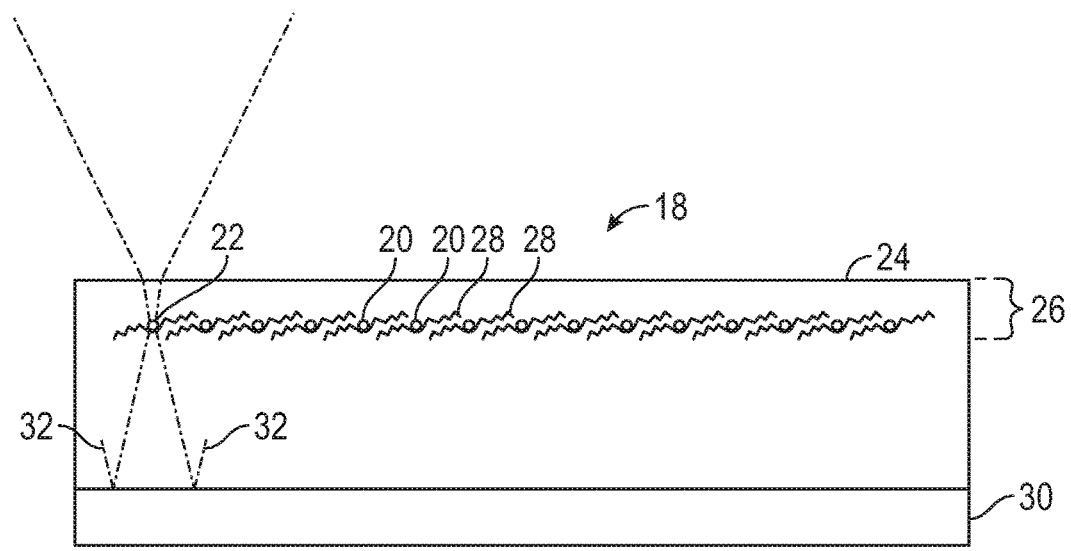
FIG. 2 is a cross sectional view of another semiconductor substrate with a finished device layer on a first surface being irradiated using a laser on a second surface.

Referring to FIG. 2, another implementation of a SiC substrate 18 is illustrated. Like the substrate in FIG. 1, a plurality of spaced apart locations 20 have been formed using laser irradiation at a focal point 22 indexed across the second surface 24 of the substrate 18. As illustrated, the damage layer 26 is formed through the effect of the plurality of spaced apart locations 20 and the corresponding cracks 28 that extend away from the locations 20 that form lines/layers of modified material that extend into the page of the drawing. FIG. 2 illustrates how, in various implementations, the formation of the damage layer 26 can take place on a substrate that has had semiconductor devices formed thereon, illustrated as device layer 30. Depending on the nature of the material in the device layer, in various implementations, laser light passing through the substrate may be reflected back into the substrate 18 as illustrated by reflection lines 32 off the device layer materials.

Figure 3:
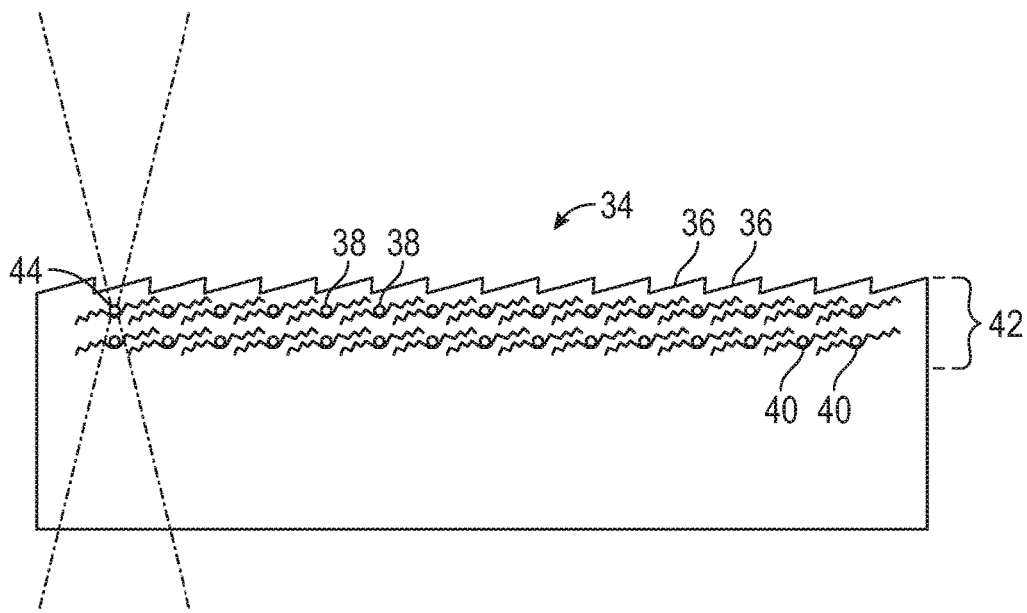
FIG. 3 is a cross sectional view of a silicon carbide semiconductor substrate (silicon carbide substrate) being irradiated using a laser on a second surface after the second surface has been separated from a boule.

FIG. 3 illustrates an SiC substrate 34 which is an SiC wafer that has been just separated from an SiC boule using a laser irradiation process like that disclosed in this document. As illustrated, the effect of the c-plane is to create various striations 36 on the surface of the wafer following separation that extend into the material of the SiC wafer at the off angle (about 4 degrees in this case). The actual shape of the striations 36 on the wafer in cross section is not as uniform or evenly spaced as illustrated in FIG. 3, as the shape in cross section in FIG. 3 is merely illustrative of the presence of the striations 36 rather than of their shape. Also, the striations are formed randomly as the material of the SiC wafer separates from the boule along the shapes of the cracks formed into the material of the wafer, so the regular pattern illustrated in FIG. 3 and other figures in this application is merely intended to show the positioning of the striations 36 on the wafer rather than their actual shape. As illustrated in FIG. 3, a first plurality of spaced apart locations 40 have been formed in the material of the SiC substrate 34 using a laser with the focal point set at the depth of the locations 40. A second plurality of spaced apart locations 38 is being formed as the laser is indexed across the substrate 34 with a focal point 44 at a second depth less than the first depth into the substrate 34. As illustrated, the effect of using the two different passes at two different depths is to form a damage layer 42 that is thicker than a damage layer formed in each pass alone.

Figure 4:
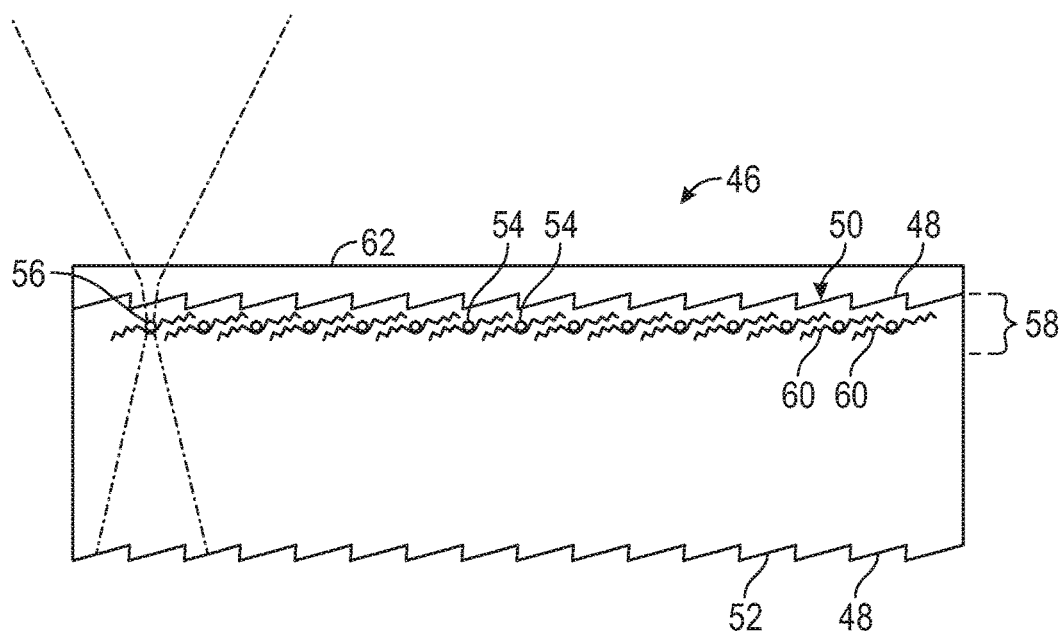
FIG. 4 is a cross sectional view of another silicon carbide substrate being irradiated using a laser on a second surface, the second surface of the silicon carbide substrate having a laser dispersion reduction layer thereon.

Referring to FIG. 4, a SiC wafer 46 that has been separated from a SiC boule after previous separation of a previous wafer from the SiC boule is illustrated. This process (assuming the top surface of the SiC boule was not ground and polished prior to processing the removal of the SiC wafer 46) results in the wafer 46 having striations 48 on both the second surface 50 and first surface 52 of the wafer 46. As illustrated, a plurality of spaced apart locations 54 have been formed by irradiation using a laser at a focal point 56 into the material of the wafer through indexing across the second surface 50 of the wafer. The plurality of spaced apart locations 54 form damage layer 58 through formation/propagation of cracks 60 from locations 58. FIG. 4 illustrates how, in particular implementations, a dispersion prevention layer 62 has been applied to the second surface 50 of the wafer 56. This dispersion prevention layer 62 includes a material designed to reduce or substantially eliminate dispersion effects of the laser light as it enters the material of the second surface 50 through the striations 48. This material may, in various implementations, be designed to have an index of refraction for the particular wavelength of laser light substantially similar to the index of refraction of SiC (or any other semiconductor substrate material being processed). In other implementations, the thickness of the dispersion prevention layer above the second surface is determined based on the particular wavelength of laser light being used to reduce and or eliminate the diffraction of the laser light. In a particular implementation, the where the laser light wavelength is represented by $\lambda$, a formula for the thickness (t) may be $t=(\lambda/4)*(2n+1)$ where n ranges between 0 and a positive integer.

In various implementations, the material of the dispersion prevention layer may be, by non-limiting example, polyvinyl alcohol, nonaqueous soluble polymers, water soluble polymers, water soluble polyester, water soluble phenol, bisphenol fluorine, poly (penta bromo phenyl methacrylate), poly (penta bromobenzyl methacrylate), iodonapthalene, bromonapthalene, gels, films, optically transmissive polyimides, oils, and any other optically transmissive water or organic based material capable of being applied over the wafer. In various implementations of dispersion prevention layers, nanoparticles including, by non-limiting example, $TiO_2$ with a refractive index of 2.1, $ZrO_2$ with a refractive index of 2.3, or any other material with a refractive index similar to the substrate may be used. In other implementations, however, no dispersion prevention layer 62 may be used.

Figure 5:
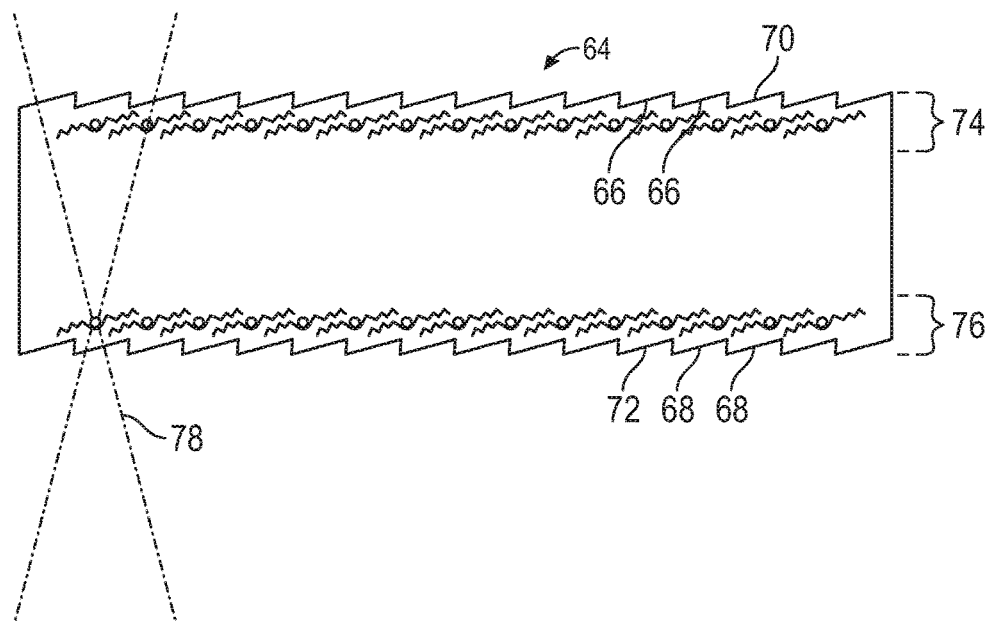
FIG. 5 is a cross sectional view of another silicon carbide substrate being irradiated by a laser on a first side following irradiation of the second side of the substrate.

Referring to FIG. 5, another SiC substrate 64 is illustrated with similar striations 66, 68 on the second surface 70 and first surface 72 of the substrate 64 like those illustrated in FIG. 4. Since this substrate 64 is to be ground and polished on both the second surface 70 and first surface 72, laser irradiation has been used to form a first damage layer 74 next to the second surface 70 and a second damage layer 76 next to the first surface 72. FIG. 5 also illustrates, that, in various implementations, the laser light 78 can be applied from the first surface 70 side of the substrate 64 without flipping the substrate over. FIG. 5 illustrates the case where a single laser light beam is used to form the first damage layer 74 and second damage layer 76 serially, or vice versa. In particular implementations, to avoid diffraction effects resulting from the cracks in the damage layer and the modified material in the damage layer, the first damage layer 74 would be formed first followed by the second damage layer 76 where the laser is being irradiated from the second surface side. The opposite course would be used where the laser is being irradiated from the first surface side of the wafer.

Figure 6:
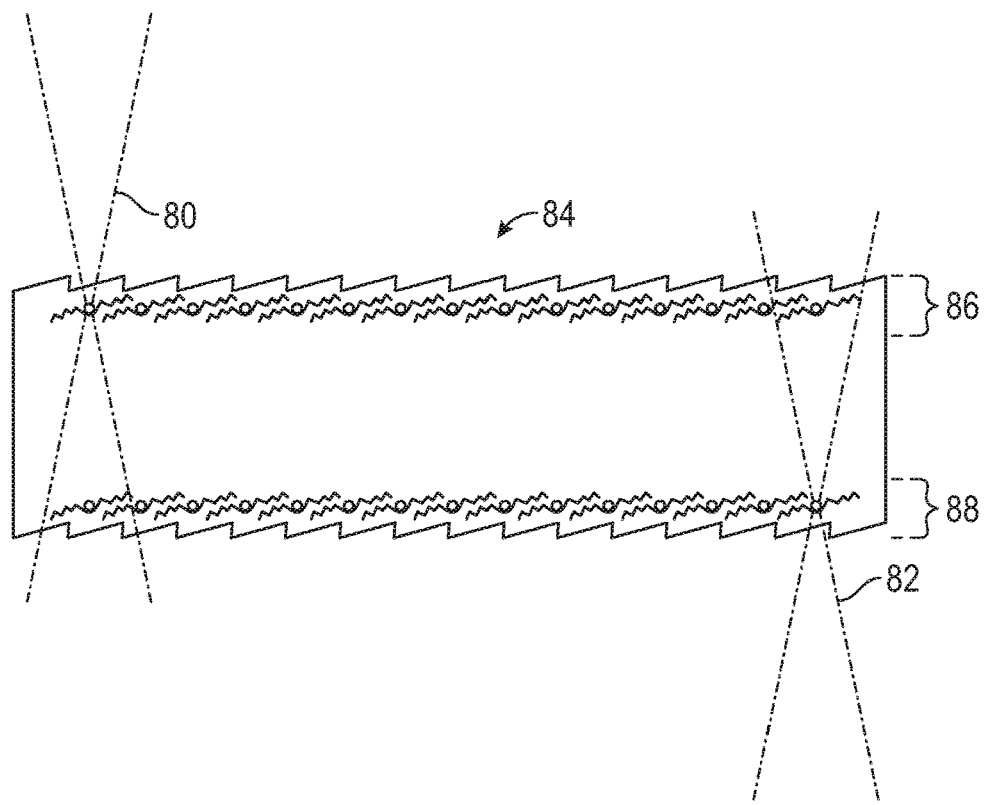
FIG. 6 is a cross sectional view of another silicon carbide substrate being irradiated by a laser on a first side and being irradiated by a laser on a second side simultaneously on opposite portions of the substrate.
Figure 7:
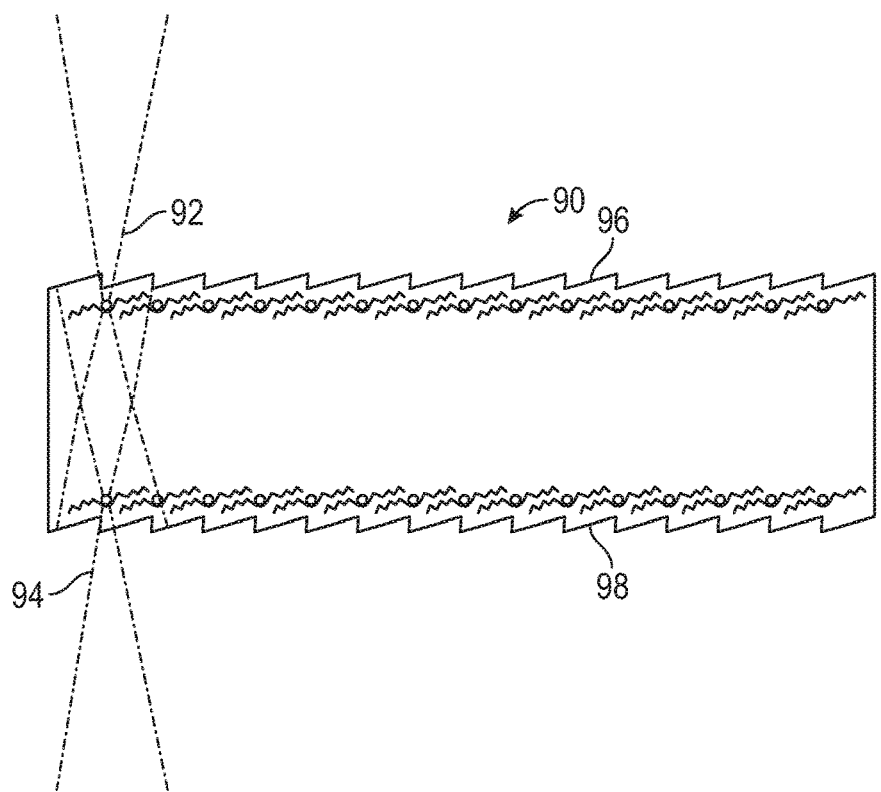
FIG. 7 is a cross sectional view of another silicon carbide substrate being irradiated by a laser on a first side and being irradiated by a laser on a second side simultaneously on positionally aligned portions of the substrate.

FIG. 6 illustrates the case where multiple laser beams 80, 82 are used to simultaneously form the first damage layer 86 and second damage layer 88 by indexing across the wafer on opposite portions of the substrate 84. In various implementations, these laser beams 80, 82 are indexing for at least part of the time spaced apart across a midpoint of the substrate 84. FIG. 7 illustrates a substrate 90 where multiple laser beams 92, 94 are irradiating the substrate simultaneously from the second side 96 and first side 98, respectively but at a positionally aligned portions of the substrate 90, substantially above (or below) each other. The particular alignment of the laser beams in various implementations where irradiation occurs from both the second side and first side of the substrate may be determined by a wide variety of factors, including, by non-limiting example, laser power, optical configuration, throughput, improvement of damage layer thickness, and any other factor driven by tool configuration, throughput, or process effectiveness.

Figure 8:
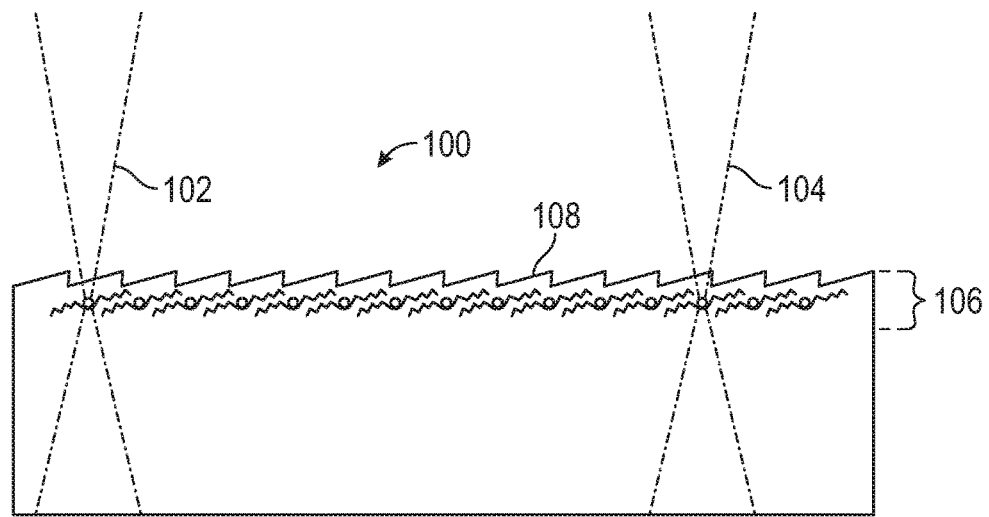
FIG. 8 is a cross sectional view of another silicon carbide substrate being irradiated by two laser beams on a second side of the substrate, the two laser beams being spaced apart across a midpoint of the substrate.
Figure 9:
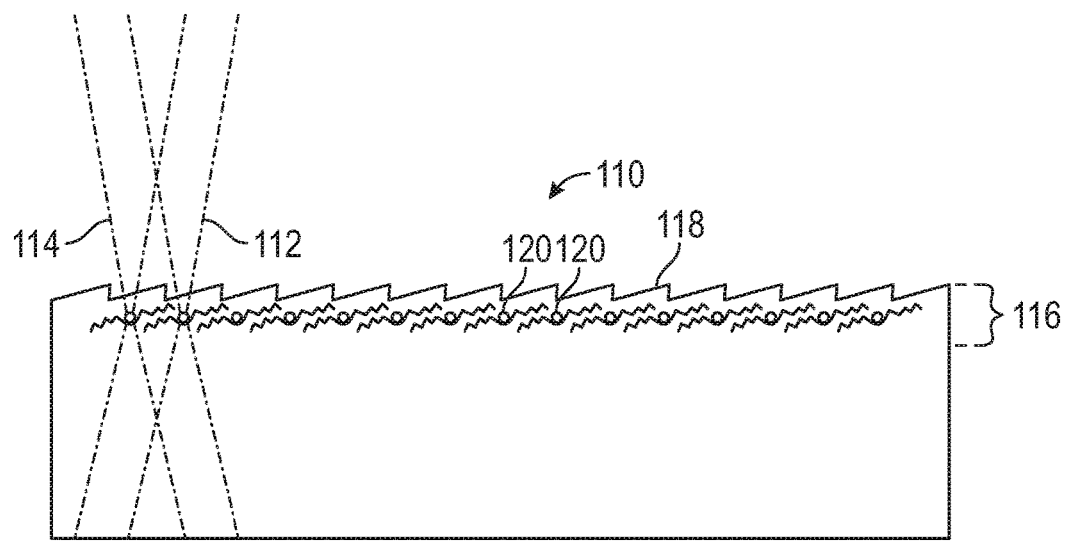
FIG. 9 is a cross sectional view of another silicon carbide substrate being irradiated by two laser beams spaced closely together.

FIG. 8 illustrates another SiC substrate 100 where two laser beams 102, 104 are being used to simultaneously form a damage layer 106 by irradiating the second side 108 of the substrate 100. As illustrated, in this implementation, the two laser beams 102, 104 are spaced apart across a midpoint of the substrate. In various implementations, the two laser beams 102, 104 may begin on opposite sides of the substrate 100 and index towards each other toward the midpoint; in others, they may begin adjacent to the midpoint, and index away from each other. FIG. 9 illustrates another SiC substrate 110 where two laser beams 112, 114 are being used to simultaneously form a damage layer 116 in the substrate 110 where the two laser beams are spaced closely together. The spacing the beams 112, 114 may be as close as adjacent locations in the plurality of spaced apart locations 120, or may be any number of spaced apart locations away from each other. In this implementation, and in all other multiple laser beam implementations disclosed in this document, the two or more laser beams used to form the damage layers may have the same characteristics, or may be different from one another in one or more of the following respects, by non-limiting example: laser type, laser wave length, spot size, power, pulse energy, pulse width, repetition rate/frequency, indexing speed, dwell time, depth into the substrate material, numerical aperture, average power, and any other desired laser characteristic. Also, the two or more laser beams may be generated by the same or different laser devices in various implementations.

Figure 10:
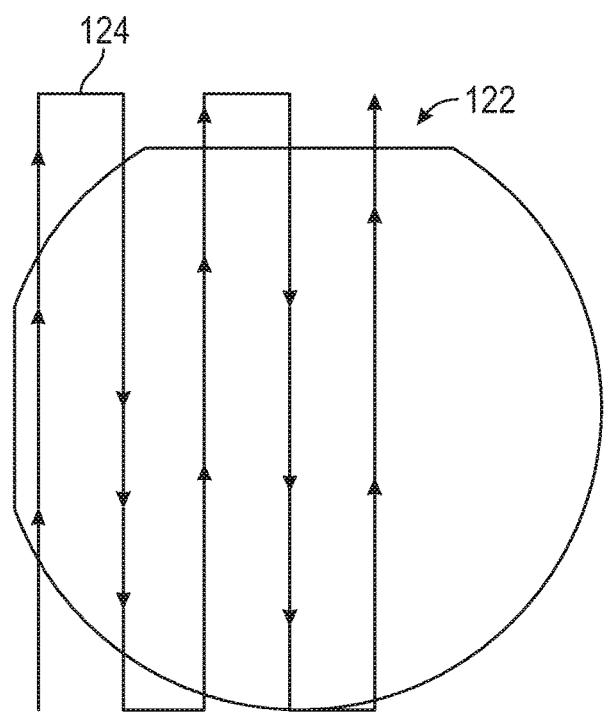
FIG. 10 is a diagram of a semiconductor substrate with an alternating single pass laser irradiation path (single pass path) illustrated thereon.

Referring to FIG. 10, a diagram of a semiconductor substrate 122 is illustrated. The particular semiconductor substrate illustrated here has two wafer flats that correspond with an SiC wafer, though the principles disclosed herein could be applied to many different substrate types. As illustrated, a path 124 followed by a laser as it irradiates the substrate with laser light is illustrated, with the path 124 indicating locations where the light irradiation occurs and a focal point within the substrate is formed. In other implementations however, the path 124 may illustrate the path of the laser as it travels across the surface of the substrate irradiating the wafer in continuous wave rather than pulsed mode operation. The path 124 illustrated in FIG. 10 is an alternating single pass path, where the laser indexes across the wafer first in the y direction, over in the x direction, and then indexes in the opposite y direction in various steps across the wafer. In various implementations, the spacing of steps in the x direction may the same, as illustrated in FIG. 10. In other implementations, however, the spacing of steps may vary across the wafer, either for an initial period, or for the entire distance across the wafer in the x direction, depending on how the damage layer forms. The spacing of the steps may be any disclosed in this document.

Figure 11:
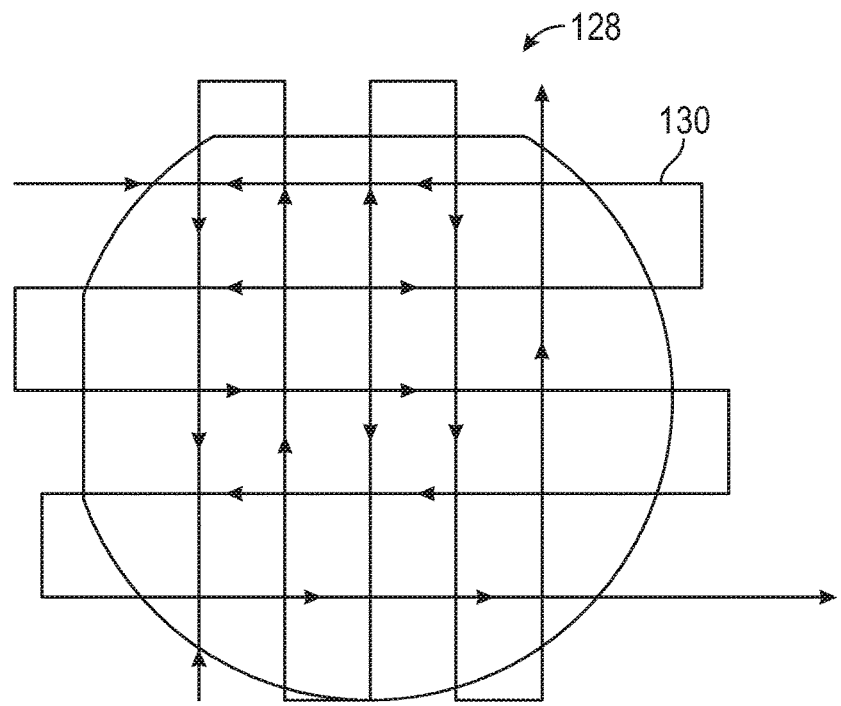
FIG. 11 is a diagram of a semiconductor substrate with an intersecting dual pass path illustrated thereon.

FIG. 11 illustrates a semiconductor substrate 128 which has been processed using an intersecting dual pass path 30. In the version of the path illustrated here, the paths are first irradiated by the laser during the first pass, and then irradiated again by the laser during the second pass. The use of dual pass paths may allow for the enhancement of the spreading of the cracking and other damage caused by the laser irradiation by giving the substrate time to cool and/or otherwise adjust the structure of the substrate between passes. This may, in turn, enhance the thickness or other desired characteristics of the damage layer formed.

Figure 12:
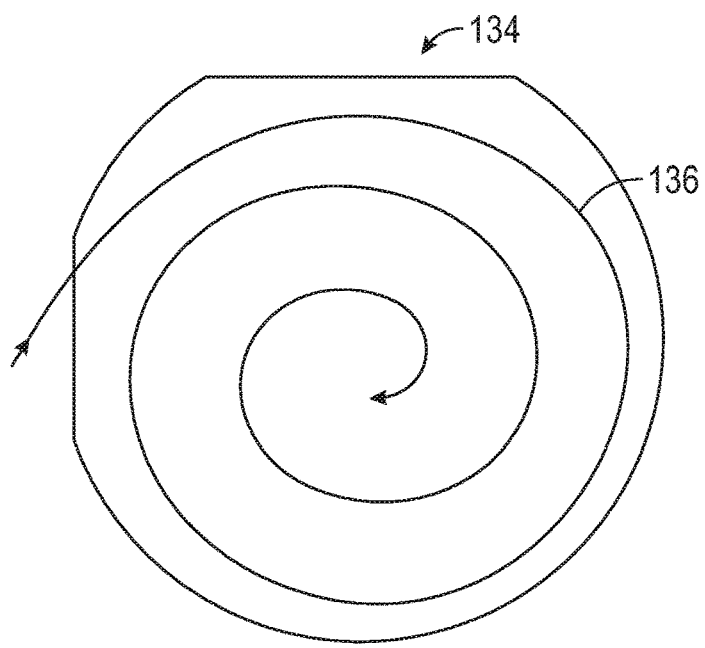
FIG. 12 is a diagram of a semiconductor substrate with a spiral single pass path illustrated thereon.

Referring to FIG. 12, a semiconductor substrate 134 which has been processed using a single pass spiral path 136 is illustrated. In various implementations, various combinations and arrangements of spiral paths may be employed, such as multi-pass paths, and spirals of various shapes and designs (more tightly arranged spirals at the beginning or end of the spiral) and various overlapping arrangements of spirals may be used. Also, for spiral (and alternating/intersecting paths), the frequency of pulses of laser irradiation along the path may be varied along the path (more points at the beginning, middle, or end of the path, or in different portions of the path than in other portions).

Figure 13:
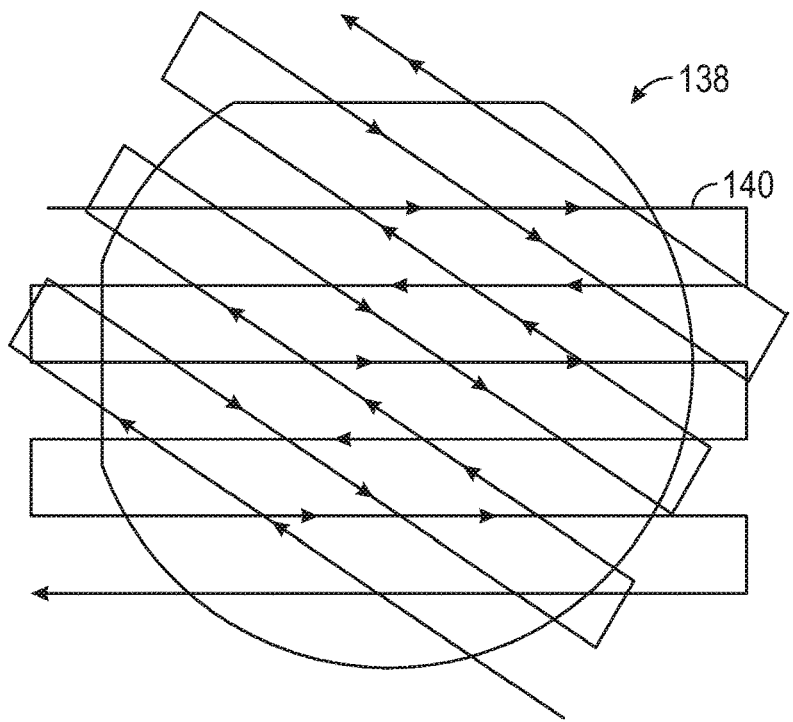
FIG. 13 is a diagram of a semiconductor substrate with an angled intersecting dual pass path illustrated thereon.

FIG. 13 illustrates another implementation of a substrate 138 with an intersecting dual pass path 140 where the second pass is angled rather than executed at about 90 degrees to the first pass. The angle at which the second pass is performed relative to the first pass may be determined by various factors, including, by non-limiting example, the orientation of crystallographic planes in the substrates, desired throughput rates through the laser process tool, desired crack positions in the damage layer, and any other process characteristic that affects the speed or efficacy of the laser treatment. Note that in FIG. 13 that some of the locations along the path of laser irradiation are common between the first pass and the second pass and other locations are unique to one of the passes.

Figure 14:
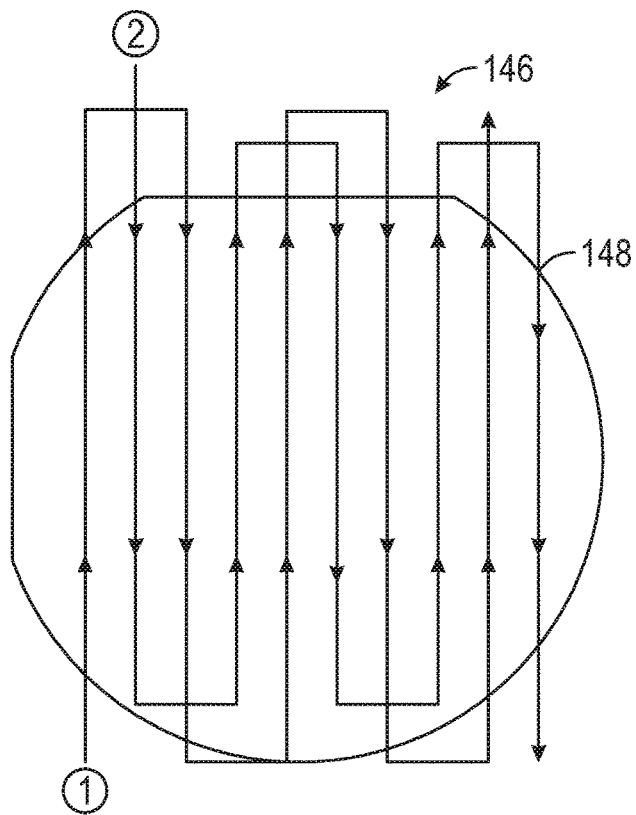
FIG. 14 is a diagram of a semiconductor substrate with a dual intersecting pass path illustrated thereon.
Figure 15:
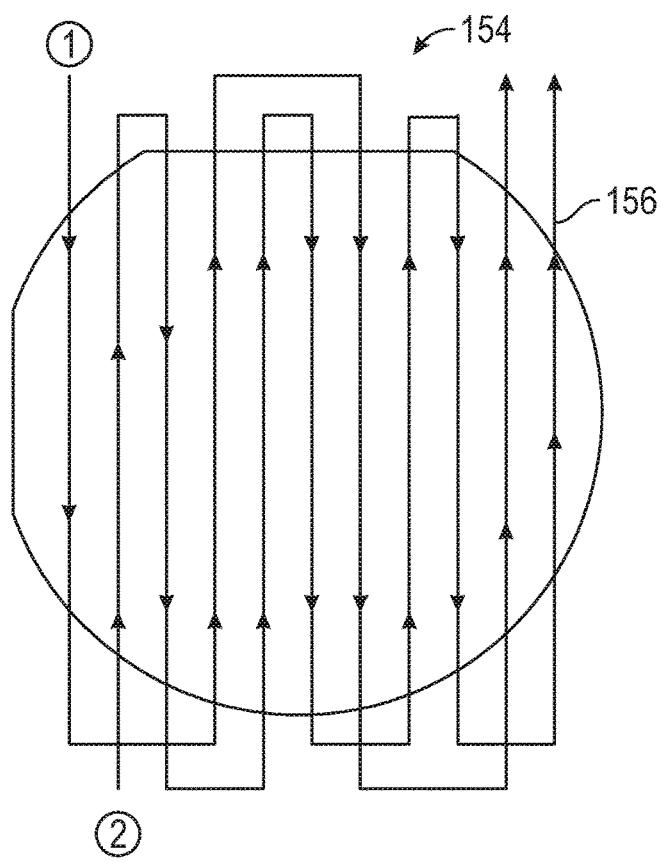
FIG. 15 is a diagram of a semiconductor substrate with another dual intersecting pass path illustrated thereon.

Referring to FIG. 14, a substrate 146 with another implementation of a dual intersecting pass path 148 is illustrated. As illustrated, in this implementation, all of the locations along the second pass are oriented substantially parallel with the locations 152 of the first pass and none are shared between the two passes. The use of this technique may, in various implementations, assist with spreading of cracks or other damage within the damage layer by allowing the substrate material to react to the damage of the first pass before the second modified layer of damage is created. FIG. 15 illustrates the case where a substrate 154 is processed using a dual intersecting pass path 156 which is executed in the reverse order from the path 148 illustrated in FIG. 14. In various implementations, the dual pass path may be executed in varying orders from substrate to substrate as the damage layer characteristics are not affected by the order of execution. In other implementations, the order in which the dual pass path is executed may affect the characteristics of the damage layer formed, so all substrates have to be executed in the same order. Where the damage layer characteristics depend on the execution order of the dual pass path, this may be caused by a wide variety of factors, including, by non-limiting example, the crystallographic planes of the substrate, the alignment of higher atomic weight atoms in one plane versus and other relative to the direction of execution of the dual pass paths, and any other material characteristics of the substrate and/or the laser light.

Many different single pass, dual pass, and more than two pass paths for processing semiconductor substrates may constructed using the principles disclosed in this document. Also, many different intersecting, spiral, alternating, alternating+spiral, random, and semi-random paths may be constructed using the principles disclosed herein. What paths are employed will depend on many of the different laser and substrate material factors desired, as well as the desired characteristics of the damage layer for use in speeding the backgrinding process.

Figure 16:
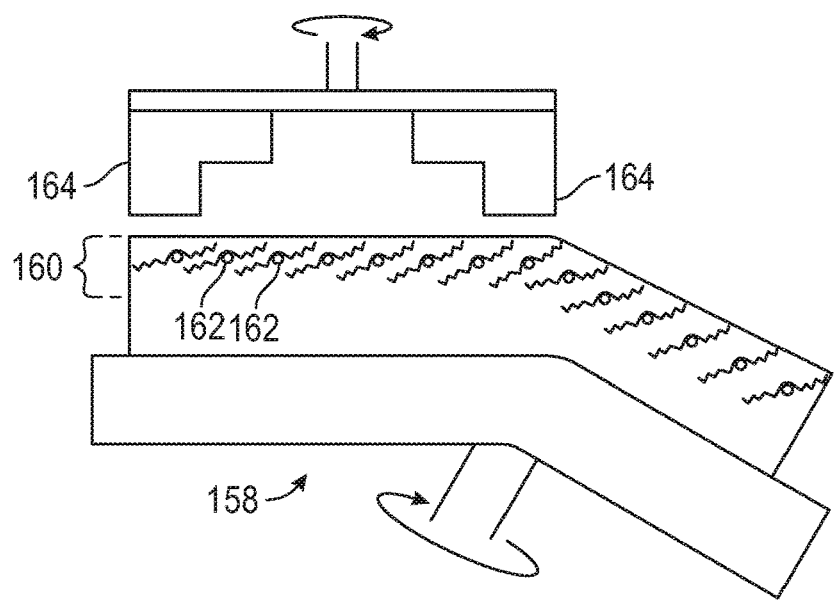
FIG. 16 is a cross sectional view of a semiconductor substrate being background to remove the damaged layer.

Referring to FIG. 16, an implementation of a substrate 158 with a damage layer 160 formed thereon is illustrated. By the presence of the angled cracks 162 in the damage layer, this is a SiC substrate. As illustrated, the substrate 158 is being rotated below a grinding wheel which has a plurality of teeth 164 thereon. The life of the grinding wheel is determined by how long the teeth 164 remain on the wheel at a usable length (size). In FIG. 16, the direction of rotation of the grinding wheel against the substrate 158 is illustrated. However, in various implementations, the substrate may rotate against the stationary grinding wheel, the grinding wheel may rotate against a stationary substrate, or both the grinding wheel and substrate may rotate relative to each other. In various implementations, various orbits (circular, eccentric, or otherwise) may be executed by the grinding wheel relative to the substrate 158 as it contacts the teeth with the substrate. Because the material of the damage layer contacts the teeth first, the rate of thinning of the material of the damage layer will be faster than the rate of thinning of undamaged material, thus speeding up the overall rate of thinning of the wafer. Also, the useful life of the teeth 164 of the grinding wheel may be increased as less wear is induced on the teeth due to the damage layer material being less wearing to remove. For particular substrate types, such as silicon carbide, the substrate may be very resistant to grinding as it is nearly as hard as the material of the teeth 164 itself. Accordingly, backgrinding/thinning process of SiC substrates takes significant time and results in significant wear on the teeth, increasing the total cost of forming/thinning each SiC wafer. This problem is exacerbated as current substrate forming technology generally creates SiC wafers that are thicker than needed because all of the fab processing equipment is designed/calibrated to operate using thicker wafers and/or the wafer separation process is unable to produce thinner ones. Because of these factors, the use of a damage layer prior to grinding may reduce the total cycle time and/or increase the life of each grinding wheel, thus reducing the cost per wafer to a significant degree.

Figure 17:
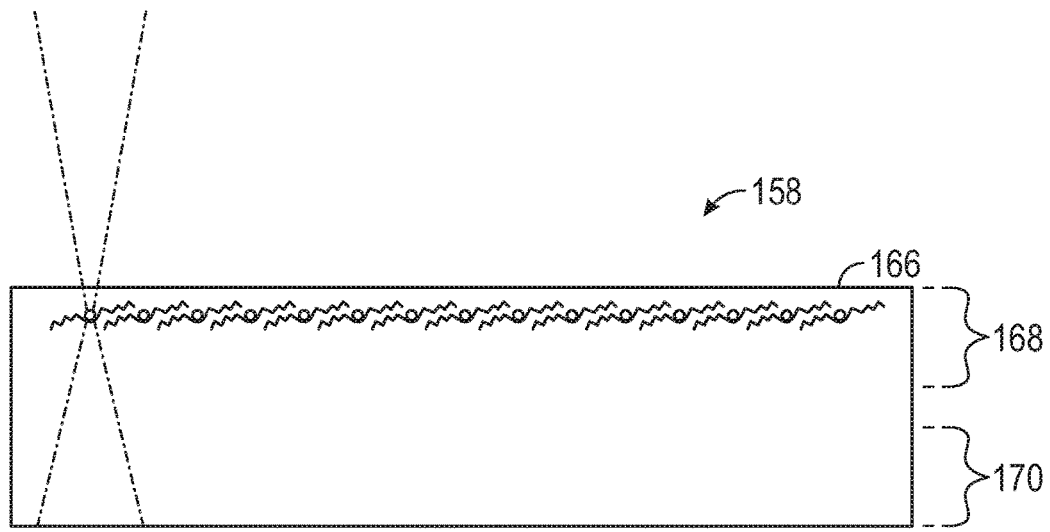
FIG. 17 is a cross sectional view of the semiconductor substrate of FIG. 16 following removal of the damaged layer being irradiated using a laser on the second surface a second time to form a damage layer.

As previously discussed, FIG. 17 shows the substrate 158 of FIG. 16 following removal of the damage layer through backgrinding being irradiated again using a laser on the second surface 166 a second time to form a second damage layer 168. FIG. 17 shows that this process may also be repeated additional times to get the wafer down to the desired thickness as indicated by braces 170. Because the removal rates of the damage layer 160, 168 material may be much higher than the removal rate of the unaffected bulk material, recursively/repetitively backgrinding between each repeated irradiation step may provide a suitable cost saving through reduced cycle time and/or consumable costs for various substrates, particularly SiC substrates.

Figure 18:
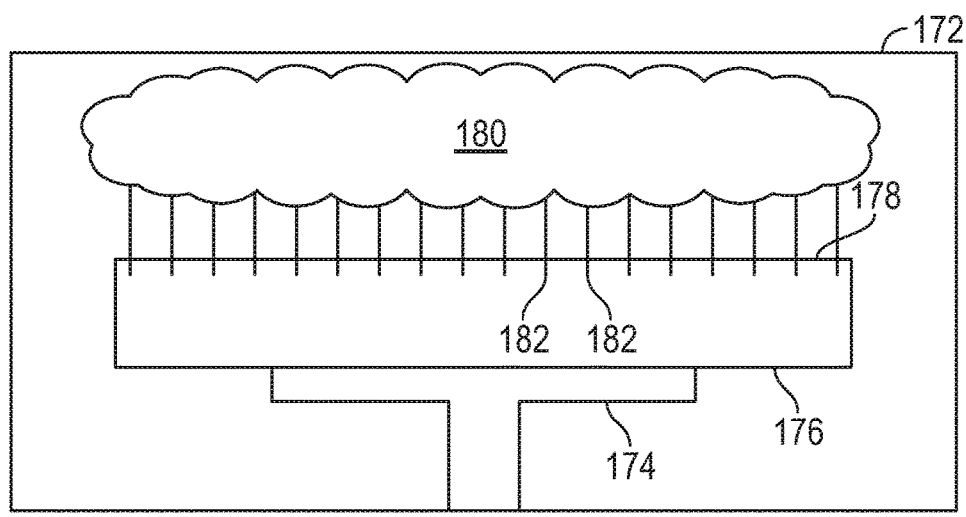
FIG. 18 is a cross sectional view of a semiconductor substrate being bombarded with a plurality of ions from a plasma to form a damage layer.

Various other methods besides irradiation of a surface of a semiconductor substrate may be employed to form a damage layer and reduce backgrinding costs accordingly. Referring to FIG. 18, a cross sectional diagram of a vacuum chamber 172 including a chuck 174 to which a semiconductor substrate 178 has been coupled. A plasma 180 has been struck/formed above the substrate 176 and operating conditions in the plasma 180 have been set to accelerate large quantities of ions 182 from the plasma 180 down onto the second surface 178 of the substrate 176. Because the goal of the plasma ions 182 is to damage the second surface of the substrate 176 and damage the internal structure of the surface as they bombard the surface, the operating conditions may be set to maximize such activity. These operating conditions may go beyond what is typically used during etch processing because normal etch processing has to avoid damage to underlying substrate materials, which is not an issue here. A wide variety of gases may be employed to form the plasma and conduct the ion bombardment, including, by non-limiting example, He, Ne, Ar, Kr, Xe, oxygen, fluorine, nitrogen, any combination thereof, and any other gas type that will tend to not chemically react with the material of the substrate but pass into it. As the ions penetrate the substrate material they will interact with and break up the structure of the material of the substrate, forming a damage layer more susceptible to removal as previously described herein. Multiple successive plasma treatments and backgrinding steps may be employed in various implementations to thin the wafer, similar to the multiple laser irradiation steps previously described.

Figure 19:
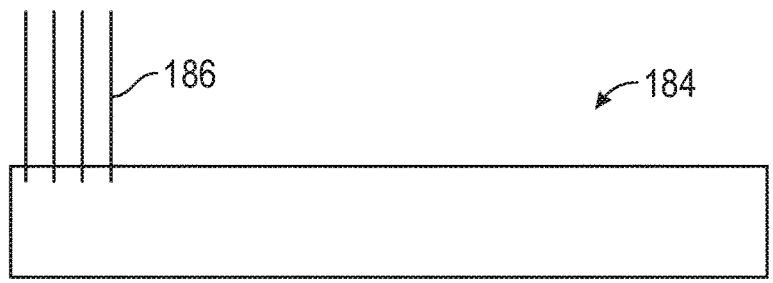
FIG. 19 is a cross sectional view of a semiconductor substrate being implanted with a plurality of ions to form a damage layer.

Referring to FIG. 19, an implementation of a semiconductor substrate 184 is illustrating being implanted with a beam of ions 186 using an ion implantation process. The beam of ions in various implementations is very high energy >200 keV and the current associated with the ion beam may be up to 30 mA or higher to ensure that the ions penetrate as deeply as possible into the material of the substrate and create as broad a damage layer through breaking up the structure of the material of the substrate. A wide variety of implantation processes may be employed and multiple implantation/backgrinding steps could be employed in various implementations. Examples of the ions that could be used for implantation may include, by non-limiting example, nitrogen, boron, argon, and any other ion type not as likely to chemically react with the material of the particular semiconductor substrate being implanted. The ion type may also be chosen based on the ion's ability to break up the atomic structure of the substrate being implanted. In various implementations, implanting using a proton beam or beam of other subatomic particles may be used. Sets of implantation parameters that achieve a substantially square (BOX) profile of penetration of the ions or particles may be utilized in various implementations to maximize the damage layer's depth/uniformity.

Figure 20:
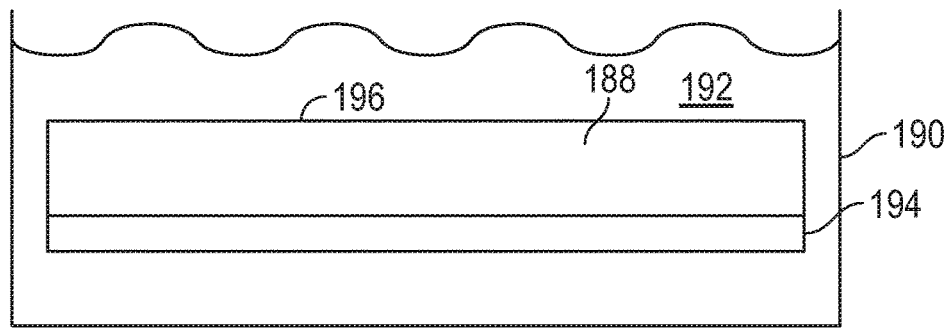
FIG. 20 is a cross sectional view of a second surface of a semiconductor substrate being exposed to a wet etchant with a protective layer on a first side to form a damage layer.

FIG. 20 illustrates a semiconductor substrate 188 immersed in a bath 190 filled with a liquid 192. One side of the substrate 188 is covered with a protective layer 194 (film, sheet, deposited film, spray or spun on coating, etc.) to prevent it from contacting the liquid 192. The liquid 192 may include any of a wide variety of chemical compounds designed to chemically interact with the structure of the particular material of the substrate 188 such as, by non-limiting example, acids, bases, electron receptors, electron donors, compounds that react selectively with carbon, compounds that react selectively with silicon, compounds that react selectively with a specific crystallographic plane of the material of the semiconductor substrate 188, hydrofluoric acid, phosphoric acid, nitric acid, acetic acid, and any other chemical capable of damaging the second surface 196 of the substrate 188. In these various implementations the liquid acts to create a damage layer into the material of the substrate 188 which can then be more easily background from the substrate 188 as previously discussed. Multiple etching/backgrinding passes on the wafer may be used in the thinning process in various implementations.

Figure 21:
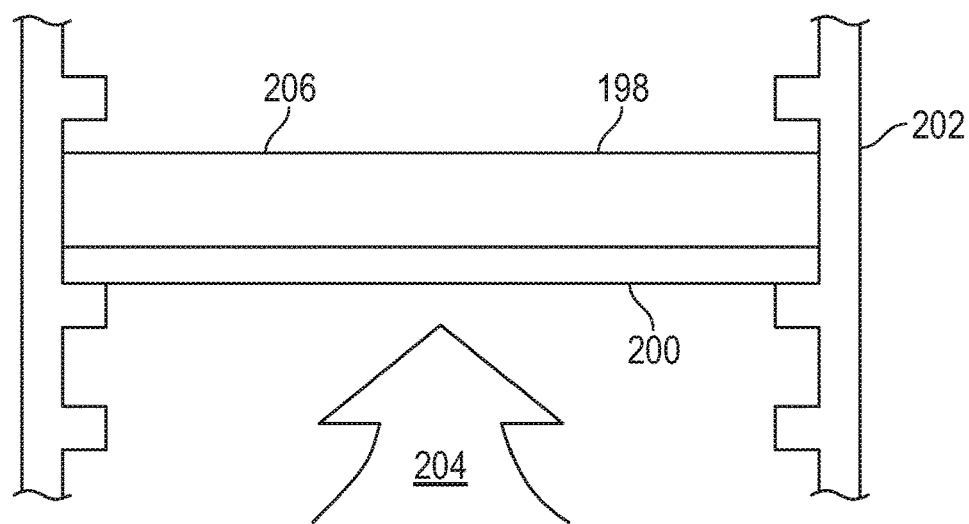
FIG. 21 is a cross sectional view of a second surface of a semiconductor substrate being exposed to a gaseous etchant with a protective layer on a first side to form a damage layer.

Referring to FIG. 21, a semiconductor substrate 198 is illustrated supported in a furnace 202 with a protective layer 204 coupled to a side of the wafer to prevent it from contacting the gas in the furnace 202. A gaseous etchant 204 is introduced into the furnace 202 and designed to react with the second surface 206 of the substrate 198 to form a damage layer into the substrate. A wide variety of gaseous etchants may be employed in various implementations, such as, by non-limiting example, hydrochloric acid, fuming nitric acid, sulfuric acid, hydrofluoric acid, strong bases and any other gaseous etchant may be utilized in various implementations. Both vertical and horizontal diffusion furnaces may be utilized to process many substrates at a time, or single substrate chambers may be employed in various implementations. Also, as previously discussed, multiple etching/backgrinding passes on the substrate may be employed as the substrate is thinned to a desired thickness.

Figure 22:
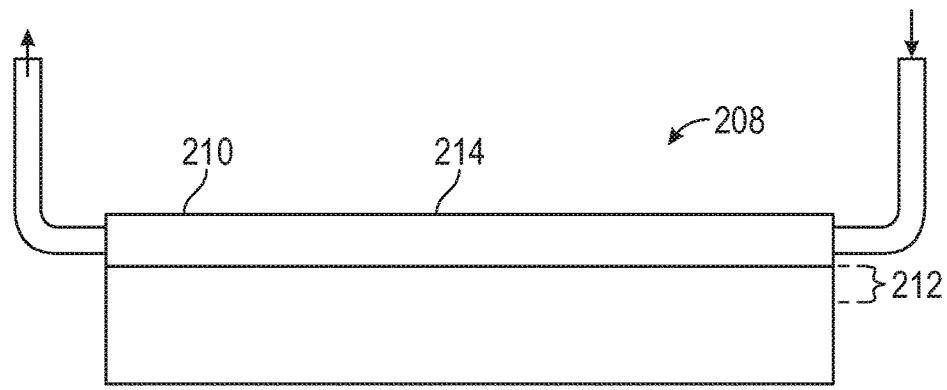
FIG. 22 is a cross sectional view of a second surface of a semiconductor substrate being rapidly locally cooled to form a damage layer.

Referring to FIG. 22, an implementation of a substrate 208 coupled with a rapid local cooling apparatus 210 is illustrated. As illustrated, the rapid thermal cooling apparatus 210 is designed to rapidly cool a portion of the substrate 208 a desired depth 212 into the wafer. Based on the coefficient of thermal expansion of the material of substrate 208, the result of the cooling may cause high stressing of the material of the substrate 208 to the desired depth. The high stress condition over a short period of time causes breakup and damage to the material of the substrate to the desired depth 212, forming a damage layer. The damage layer can then be removed after the substrate 208 is decoupled from the rapid local cooling apparatus 210 through backgrinding. As with the other methods for forming damage layers, multiple cooling and backgrinding cycles may be employed in the process of thinning the substrate 208. The rapid local cooling apparatus 210 may take many various forms and employ various structures. For example, in one implementation, liquid nitrogen, ammonia, or another liquefied coolant may be passed through into a distribution plate 214 coupled to the substrate 208. In various implementations, the distribution plate may be pre-cooled before contacting the substrate 208, or it may be cooled after being coupled to the substrate. In various implementations, an intermediate material/structure may be used to couple the substrate 208 to the distribution/cooling plate 214, including, by non-limiting example, a thermal grease, a water soluble gel, an adhesive, a magnetic coupler, a clamp, and any other system or method of holding the substrate to the distribution plate.

Figure 23:
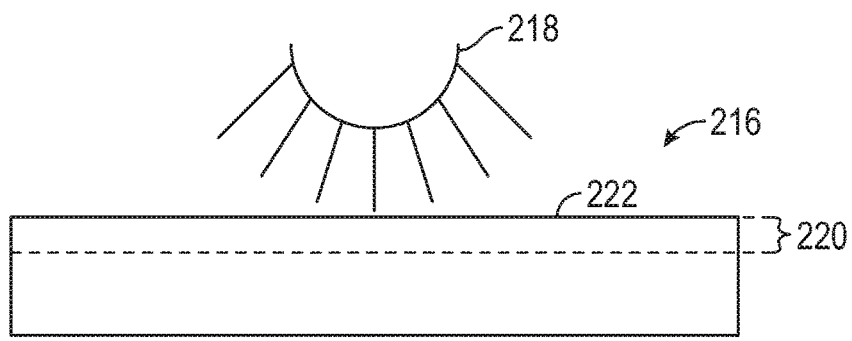
FIG. 23 is a cross sectional view of a second surface of a semiconductor substrate being rapidly locally heated to form a damage layer.

FIG. 23 illustrates a semiconductor substrate 216 being rapidly locally heated by a heat source [represented by a light source 218 in FIG. 23, but the heat source could also be a thermally conductive/convective heat source (electrical, combustive, plasma, etc.) in various implementations]. As illustrated, the rapid local heating of the substrate 216 results in damage to the structure of the substrate down to a certain level within the substrate due to high stressing of the material based on coefficient of thermal expansion effects. This forms a damage layer 220 in the substrate from the second side 222 of the substrate. As previously discussed, following backgrinding of the material of the damage layer 220, additional rapid local heating/backgrinding steps may be utilized in the process of thinning the substrate 216 to the desired thickness. As with the other damage inducing processes discussed in this document, the number of backgrinding steps depends on the depth of the damage layer formed through the particular damaging technique employed. A wide variety of equipment types could be used to conduct the rapid thermal heating, including, by non-limiting example, rapid thermal annealing (RTA) equipment using light irradiation, short dwell times on preheated oven plates, ovens applying superheated gas jets to the second surface of the substrate, and any other system designed to rapidly heat the second side of the substrate in a very short period of time.

Figure 24:
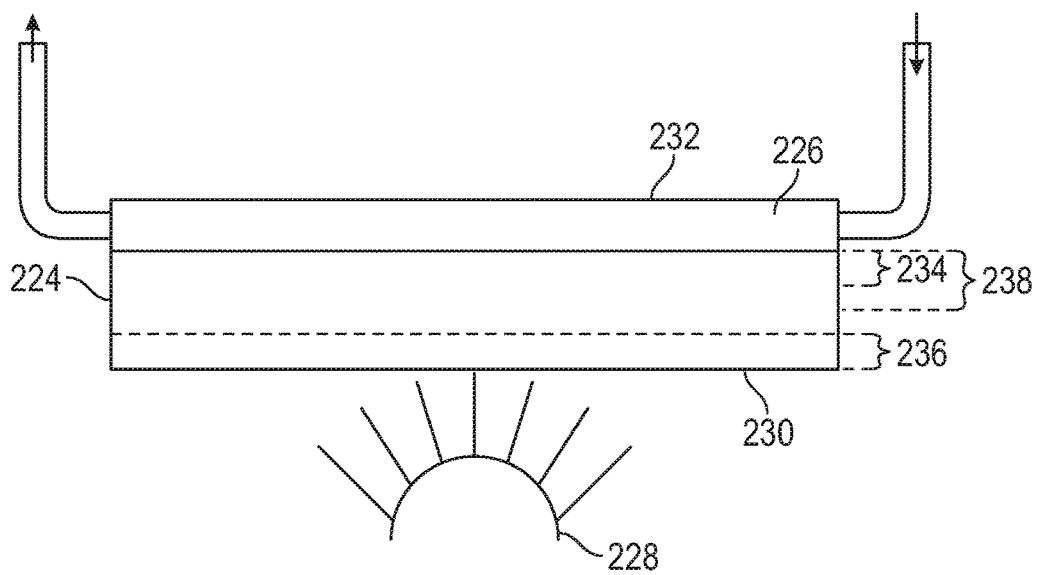
FIG. 24 is a cross sectional view of a second surface of a semiconductor substrate being rapidly locally cooled while a first surface is being rapidly locally heated to form a damage layer.

Referring to FIG. 24, an implementation of a system that rapidly locally heats the first side 230 of a semiconductor substrate 224 while rapidly locally cooling the second side 232 of the substrate 224 simultaneously is illustrated. The system used to rapidly locally cool may be any disclosed in this document, as may the system for rapidly locally heating the substrate. Systems that employ rapid local heating and cooling simultaneously may form damage layers 234, 236 adjacent to the second side 232 and first side 230 of the substrate, respectively. This may allow the wafer to be thinned more rapidly simply by being able to have the backgrinding tool remove the damage layer from both sides of the wafer in two separate backgrinding steps, allowing for potentially twice as much damage layer material to be removed in each thinning cycle. However, in other implementations, the use of this technique may be designed, depending on the coefficient of thermal expansion of the material of the semiconductor substrate, to create a broader damage layer 238 adjacent to either the first surface 230 or second surface 232 of the substrate 224. This broader damage layer may result from, by non-limiting example, the position of the peak temperature within the material of the substrate, the position of the peak high or peak low temperature of the transient thermal gradient created within the material of the substrate, the duration of the temperature swing from low temperature to high temperature or from high temperature to low temperature, or any other transient thermal phenomenon within the material of the substrate.

While the use of simultaneous rapid local heating and local cooling has been described in reference to FIG. 24, in other implementations, either the heating or the cooling may not be done simultaneous with the rapid cooling or rapid heating. Instead, the either the heating or cooling system may be used to bring the substrate 224 to a steady state elevated or lowered temperature relative to ambient temperature and then the substrate 224 is subjected to a rapid local cooling or rapid local heating process, respectively. The use of preheating or precooling the substrate may assist in widening the width of the damage layer or increasing the damage in the damage layer on the side of the wafer being rapidly thermally processed by increasing the local temperature gradient between the rapid thermal heating or cooling process. A wide variety of potential variations may be constructed using the principles disclosed in this document.

Various methods of forming damage layers and techniques of forming the same have been disclosed in this document. While these have been described separately, in various semiconductor substrate thinning methods and systems, any combination of the various methods may be utilized together in combination in various implementations. By non-limiting example, a damage layer(s) may first be formed using any of the laser irradiation methods disclosed in this document and may then be followed by further damage layer formation using ion bombardment, rapid heating/cooling, or any combination thereof. A wide variety of various damage layer formation methods using various combinations of the different damage layer formation methods disclosed in this document may be constructed using the principles disclosed herein.

In places where the description above refers to particular implementations of semiconductor substrate thinning methods and systems and implementing components, sub-components, methods and sub-methods, it should be readily apparent that a number of modifications may be made without departing from the spirit thereof and that these implementations, implementing components, sub-components, methods and sub-methods may be applied to other semiconductor substrate thinning methods and systems.

What is claimed is:

1. A method of thinning a semiconductor substrate comprising:
   providing a semiconductor substrate having a first surface and a second surface opposing the first surface;
   inducing damage into a portion of the semiconductor substrate adjacent to the second surface forming a damage layer; and
   backgrinding the second surface of the semiconductor substrate.

2. The method of claim 1, wherein a lifetime of a backgrinding wheel is increased through the presence of the damage layer.

3. The method of claim 1, further comprising one of:
   after backgrinding the second surface of the semiconductor substrate, inducing damage into a portion of the semiconductor substrate adjacent to the second surface forming a second damage layer and backgrinding the second surface of the semiconductor substrate to remove at least the second damage layer;
   after inducing damage into the portion of the semiconductor substrate, again inducing damage into the portion of the semiconductor substrate adjacent to the second surface before backgrinding the second surface of the semiconductor substrate.

4. The method of claim 1, wherein a thinning rate is increased while a backgrinding wheel grinds the damage layer.

5. The method of claim 1, wherein inducing damage into the portion of the semiconductor substrate further comprises irradiating the second surface with a laser beam at a focal point within the semiconductor substrate at a plurality of spaced apart locations along the second surface to form the damage layer.

6. The method of claim 5, wherein the method further comprises forming one or more cracks into the semiconductor substrate surrounding each of the plurality of spaced apart locations.

7. The method of claim 5, wherein the semiconductor substrate is silicon carbide.

8. The method of claim 5, wherein irradiating the second surface with the laser beam at the focal point within the semiconductor substrate at the plurality of spaced apart locations further comprises irradiating the plurality of spaced apart locations using a predefined path.

9. The method of claim 8, wherein the predefined path is one of an alternating single pass path, an intersecting single pass path, a spiral single pass path, an alternating dual pass path, a dual intersecting pass path, a spiral dual pass path, a random single pass path, a random dual pass path, a single pass path, a two or more pass path, an intersecting dual pass path, an overlapping single pass path, an overlapping dual pass path, and any combination thereof.

10. The method of claim 1, wherein inducing damage into the portion of the semiconductor substrate further comprises bombarding the second surface with a plurality of ions from a plasma adjacent to the second surface to form the damage layer.

11. The method of claim 1, wherein inducing damage into the portion of the semiconductor substrate further comprises implanting the second surface with a plurality of ions to form the damage layer.

12. The method of claim 1, wherein inducing damage into the portion of the semiconductor substrate further comprises exposing the second surface to an etchant to form the damage layer.

13. The method of claim 1, wherein inducing damage into the portion of the semiconductor substrate further comprises locally rapidly cooling the second surface to form the damage layer.

14. The method of claim 1, wherein inducing damage into the portion of the semiconductor substrate further comprises locally rapidly heating the second surface to form the damage layer.

15. The method of claim 13, further comprising one of:
   locally rapidly heating the first surface while locally rapidly cooling the second surface to form the damage layer; and
   locally rapidly heating the second surface while locally rapidly cooling the first surface to form the damage layer.

16. A method of preparing a semiconductor substrate for thinning, the method comprising:
   providing a semiconductor substrate having a first surface and a second surface opposing the first surface; and
   forming a damage layer in a portion of the semiconductor substrate adjacent to the second surface, the damage layer configured to increase a thinning rate when a backgrinding wheel is grinding the damage layer.

17. The method of claim 16, wherein forming the damage layer in the portion of the semiconductor substrate adjacent to the second surface further comprises irradiating the second surface with a laser beam at a focal point within the semiconductor substrate at a plurality of spaced apart locations along the second surface to form the damage layer.

18. The method of claim 17, wherein the substrate is silicon carbide.

19. The method of claim 17, wherein the method further comprises forming one or more cracks into the semiconductor substrate surrounding each of the plurality of spaced apart locations.

20. The method of claim 16, wherein forming the damage layer in the portion of the semiconductor substrate adjacent to the second surface further comprises one of:
   bombarding the second surface with a plurality of ions from a plasma adjacent to the second surface to form the damage layer;
   implanting the second surface with a plurality of ions to form the damage layer;
   exposing the second surface to an etchant to form the damage layer;
   locally rapidly cooling the second surface to form the damage layer;
   locally rapidly heating the second surface to form the damage layer;
   locally rapidly heating the first surface while locally rapidly cooling the second surface to form the damage layer;
   locally rapidly heating the second surface while locally rapidly cooling the first surface to form the damage layer; and
   any combination thereof.

* * * * *